United States Patent
Shiue et al.

(10) Patent No.: US 7,104,817 B2
(45) Date of Patent: Sep. 12, 2006

(54) DUST-PROOF STRUCTURE FOR CARD CONNECTOR IN HANDHELD ELECTRONIC DEVICE

(75) Inventors: Jih-Jeng Shiue, Sindian (TW); Jih-Chen Yeh, Sindian (TW)

(73) Assignee: High Tech Computer, Corp., Tao Yuan (TW)

( * ) Notice: Subject to any disclaimer, the term of this patent is extended or adjusted under 35 U.S.C. 154(b) by 0 days.

(21) Appl. No.: 10/941,245

(22) Filed: Sep. 14, 2004

(65) Prior Publication Data

US 2005/0279522 A1      Dec. 22, 2005

(30) Foreign Application Priority Data

Jun. 18, 2004  (TW) .............................. 93209624 U

(51) Int. Cl.
*H01R 13/44* (2006.01)
(52) U.S. Cl. ...................................... 439/137; 439/136
(58) Field of Classification Search ........ 439/135–137, 439/928.1; 361/686; 174/50.52, 66–67
See application file for complete search history.

(56) References Cited

U.S. PATENT DOCUMENTS

| | | | |
|---|---|---|---|
| 4,017,140 A * | 4/1977 | Reavis et al. ................ 439/408 |
| 4,795,354 A | 1/1989 | Owen .......................... 439/137 |
| 5,559,672 A * | 9/1996 | Buras et al. ................. 361/684 |
| 5,701,216 A | 12/1997 | Yamamoto et al. ........ 360/99.02 |
| 5,820,236 A * | 10/1998 | Aoki .......................... 312/223.2 |
| 6,133,531 A * | 10/2000 | Hayduke et al. .............. 174/67 |
| 6,377,451 B1 | 4/2002 | Furuya .......................... 361/686 |
| 6,877,999 B1 * | 4/2005 | Hashimoto ................... 439/138 |

* cited by examiner

*Primary Examiner*—Michael C. Zarroli
(74) *Attorney, Agent, or Firm*—J.C. Patents

(57) ABSTRACT

A dust-proof structure (200) for an electronic device is disclosed. The electronic device includes a case (208) having a slot (208a) aligned with a card connector (204) in the electronic device. The dust-proof structure includes a frame (212) formed on the case and around the slot, and a dust-proof gate (210) made of resilient material. The dust-proof gate is attached to the case at a position surrounded by the frame and covering the slot. The dust-proof gate has a slit (210a) positioned communicating with the slot, wherein the slit extends along a direction parallel to a longitudinal length of the slot. To insert an electronic card (202) into the electrical device to electrically connect with the card connector, the card is moved first through the slot of the case and then the slit of the dust-proof gate.

14 Claims, 4 Drawing Sheets

DUST-PROOF STRUCTURE FOR CARD CONNECTOR IN HANDHELD ELECTRONIC DEVICE

CROSS-REFERENCE TO RELATED APPLICATION

This application claims the priority benefit of Taiwan application serial no. 93209624, filed on Jun. 18, 2004.

BACKGROUND OF THE INVENTION

1. Field of the Invention

The present invention relates to a dust-proof structure, and more particularly, to a dust-proof structure provided on a case of a handheld electronic device for preventing a card connector in the electronic device from being contaminated by dust.

2. Description of Related Art

The multi-media technology has ushered into a new era. A lot of handheld electronic devices like digital camera, PDA, and mobile phone, have been developed, which are required to embody the multi-media technology and thus need a card connector to connect with a memory card, a game card or an extension card. The card is simply inserted into a case of the device through a slot in the case to connect with the card connector. The device usually does not have means on the case for preventing dust from entering into the device through the slot. When dust enters into the device through the slot, it will accumulate on the connector and contaminate contacts of the connector. The contamination of the contacts adversely affects a normal connection between the connector and the inserted card, and accordingly, a normal operation of the handheld electronic device.

FIG. 1 is a schematic perspective, exploded view of a handheld electronic device and a memory card 102, according to the prior art. Referring to FIG. 1, the handheld electronic device has a case 108 defining a slot 108a therethrough, a printed circuit board 106 and a card connector 104 mounted on the printed circuit board 106. The card connector 104 and the printed circuit board 106 are accommodated in the case 108. The slot 108a is aligned with the card connector 104 so that when the memory card 102 is inserted into the case 108 through the slot 108a, the memory card 102 can electrically connect with the card connector 104. However, the handheld electronic device lacks a means, which can prevent dust from entering an inside of the device through the slot 108a. The dust entering the inside of the device may accumulate on and contaminate the card connector 104 and the circuit board 106.

In order to prevent dust from contaminating an electrical connector, U.S. Pat. No. 4,795,354 discloses a dust-proof structure attached to an electrical connector. The dust-proof structure is constructed from two flexible layers and a rigid layer, wherein the two flexible layers are laminated on the rigid layer. The outer one of the flexible layers can be a woven monofilament synthetic fiber, such as nylon. The inner one of the flexible layers can be non-woven and rubber-like, such as natural rubber, silicon rubber, neoprene and so on. The rigid layer is, for example, plastic. However, due to structural limitation, the dust-proof structure of the prior art cannot be not be easily attached to the card connector of the handheld electronic device to prevent the contamination thereof.

U.S. Pat. No. 6,377,451 and U.S. Pat. No. 5,701,216 each discloses a dust-proof structure comprising two panels capable of rotating about two respective shafts. The two panels are urged by springs to close an insertion port thereby to prevent dust from entering an inside of an electronic device. However, the dust-proof structures are mechanisms with a complex setup, numerous parts, a larger size and requires a high production cost.

SUMMARY OF THE INVENTION

Accordingly, one object of the present invention is to provide a dust-proof structure for preventing dust from entering a handheld electronic device such as digital camera, PDA or mobile phone, to contaminate a card connector therein. The dust-proof structure has a simple structure and can be easily assembled to the electronic device. Furthermore, the dust-proof structure can effectively block dust from entering the electronic device.

To achieve these and other advantages and in accordance with the purpose of the invention, the present invention provides a dust-proof structure for an electronic device to prevent dust from entering the electronic device to contaminate a card connector therein. The electronic device includes a case having a slot aligned with the card connector in the electronic device. An electronic card is moved through the slot to electrically connect with the card connector. The dust-proof structure includes a frame and a dust-proof gate. The frame is positioned on a surface of the case around the slot. The dust-proof gate is secured to the case and covers the slot. The dust-proof gate is so positioned that it is surrounded by the frame. The dust-proof gate has a slit positioned in communication with the slot, wherein the slit extends in a longitudinal direction parallel to a longitudinal length of the slot. When the card is moved through the slot to enter the electronic device to electrically connect with the card connector, the card also moves through the slit.

In an embodiment of the present invention, the frame is integrally formed on an inner surface of the case by plastic injection molding. Alternatively, the frame can be made of hard plastic or metal individually and then bonded on the inner surface of the case with an adhesive.

The material for forming the dust-proof gate is resilient material, such as resilient sponge or soft rubber. The dust-proof gate has two holes at two ends of the slit, respectively. The slit has a longitudinal length greater or equal to that of the slot. The holes are provided for releasing stress concentration at the two ends of the slit. The stress concentration occurs when the electronic card moves through the slit.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE ILLUSTRATED EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

First Embodiment

Figure 1:
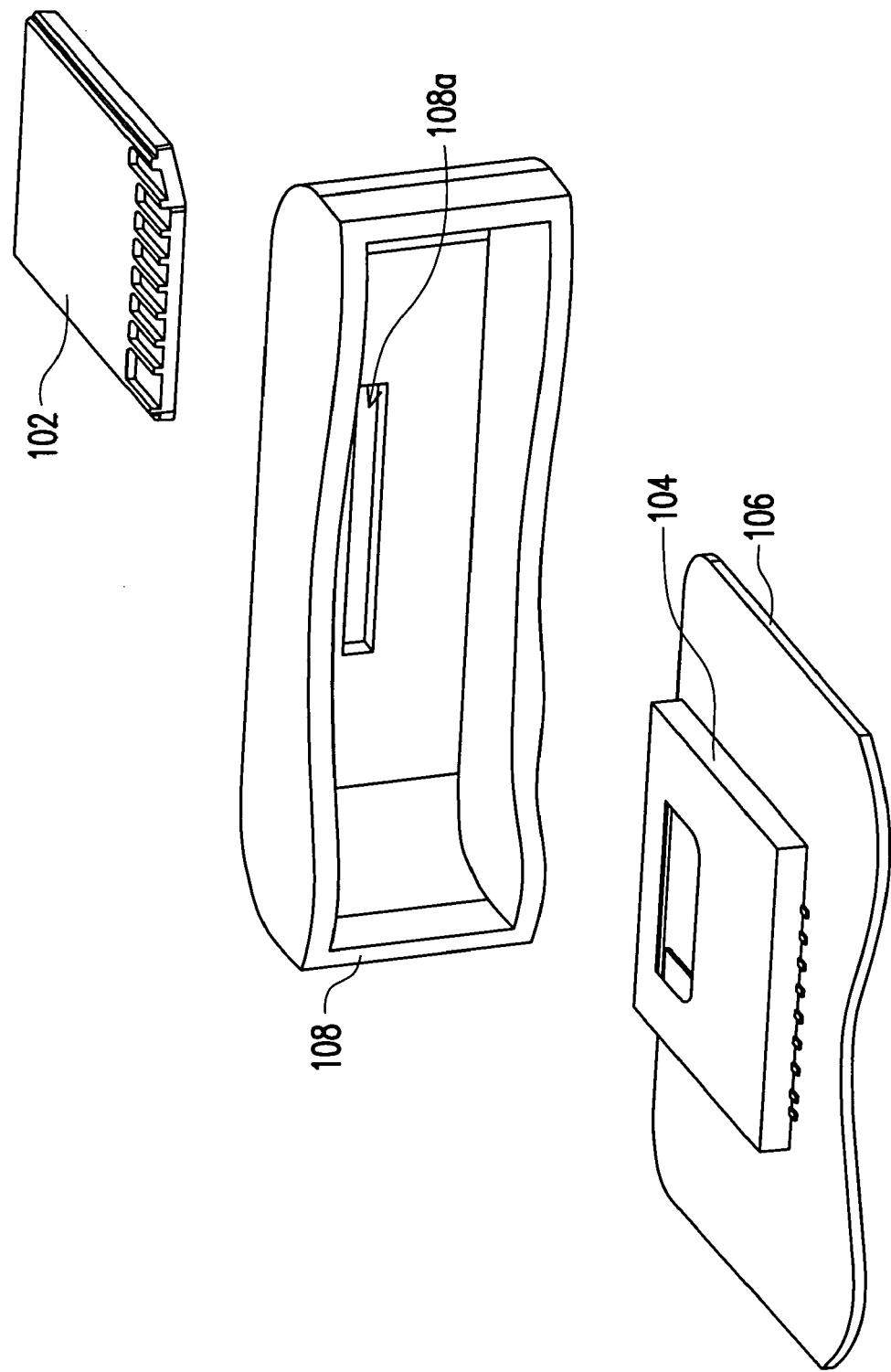
FIG. 1 is a schematic perspective view of a case of a handheld electronic device, a memory card, a printed circuit board and a card connector according to the prior art.
Figure 2:
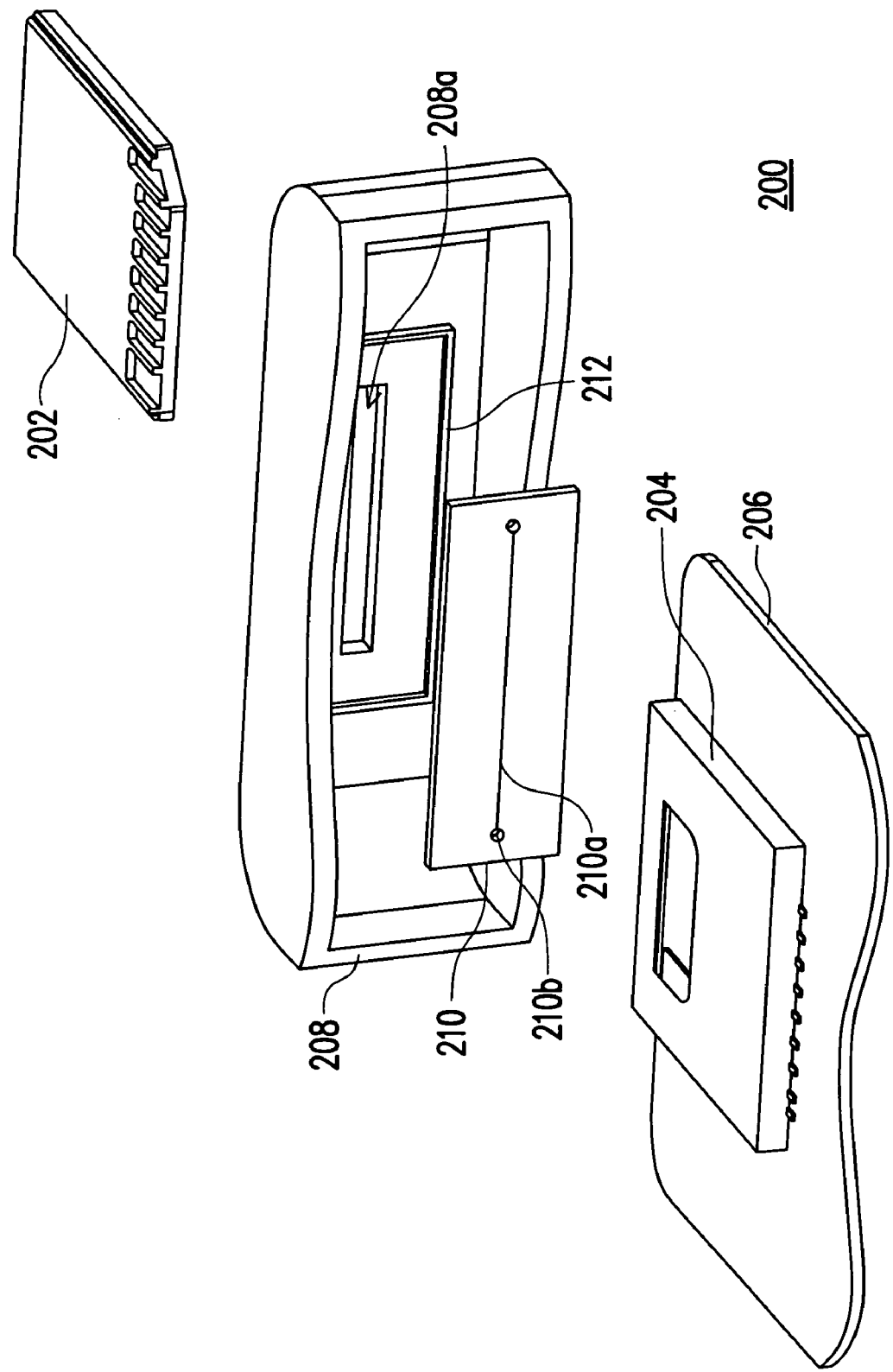
FIG. 2 is a schematic perspective view of a case of a handheld electronic device, a memory card, a printed circuit board, a card connector and a dust-proof structure according to a first embodiment of the present invention.

FIG. 2 is a schematic perspective view of a dust-proof structure 200 according to a first embodiment of the present invention. The dust-proof structure 200 is used for preventing dust or particles from entering an electronic device (not labeled), particularly a handheld electronic device, for example, a personal digital assistant (PDA) or a mobile phone, to contaminate a card connector 204 therein. The electronic device has a case 208 defining a slot 208a through which an electronic card 202 can enter the electronic device to electrically connect with the card connector 204. The card connector 204 is mounted on a printed circuit board 206 in the electronic device. The dust-proof structure 200 includes a frame 212 and a dust-proof gate 210. The frame 212 is configured on the case 208 surrounding the slot 208a of the case 208. The dust-proof gate 210 is secured to an inner surface of the case 208 by an adhesive and located inside the frame 212. The frame 212 fittingly surrounds the dust-proof gate 210. The frame 212 is devised to facilitate a proper positioning of the dust-proof gate 210 on the case 208 relative to the slot 208a. The dust-proof gate 210 covers the slot 208a for preventing dust or particles from entering into the electronic device. The dust-proof gate 210 has a slit 210a positioned in communication with the slot 208a, wherein the slit 210a extends in a direction parallel to the longitudinal length of the slot 208a. When the electronic card 202 moves through the slot 208a to enter the electronic device, the electronic card also moves through the slit 210a.

The frame 212 can be integrally formed on the inner surface of the case 208 by plastic injection molding. Alternatively, the frame 212 can be made of hard plastic or metal individually and then bonded to the inner surface of the case 208 by an adhesive. The material of the dust-proof gate 210 can be resilient sponge, soft rubber or other suitable resilient materials.

The dust-proof gate 210 is formed as a rectangular plate. The slit 210a is formed by cutting the dust-proof gate 210 with a cutter. The dust-proof gate 210 covering the slot 208a can avoid dust or particles from moving through the slot 208a into the electronic device to contaminate the card connector 204 or the printed circuit board 206. The slit 210a has a very small width when there is no card moves therethrough; thus, no dust can enter the electronic device. When the electronic card 202 moves through the slit 210a, the slit 210a is conformably expanded by the card 202. Accordingly, the dust-proof gate 210 can provide an excellent dust-proof effect. In addition, the dust-proof gate 210 can remove dust or particles accumulated on the card 202 by a wiping action of the dust-proof gate 210 acting on the card 202 when the card 202 is moved through the slit 210a. The dust-proof gate 210 has two stress-releasing round holes 210b at two ends of the slit 210a, respectively, to prevent a concentration of stress at the two ends of the slit 210a when a card 202 is moved through the slit 210a. However, the present invention is not limited to using round holes, other configurations of the holes which can prevent stress concentration can be used. The slit 210a is shaped as a straight line having a length preferably greater or equal to that of the slot 208a. Further, the stress-releasing holes 210b are preferably not be exposed to the slot 208a to achieve a better dust-proof effect.

According to the present invention, the dust-proof structure 200 including the frame 212 and the dust-proof gate 210 is a simple setup and is easily assembled so that the manufacturing cost can be lowered. When the card 202 is inserted through the slit 210a, the card 202 first pushes to open the slit 210a and is then inserted into the card connector 204 in the case 208. In the meantime, the dust-proof gate 210 can remove dust or particles accumulated on the card 202 while being inserted. When the inserted card 202 is being ejected from the card connector 204, the dust-proof gate 210 can provide a buffering force to the ejected card 202 to prevent it from incidentally dropping from the electronic device.

Second Embodiment

Figure 3:
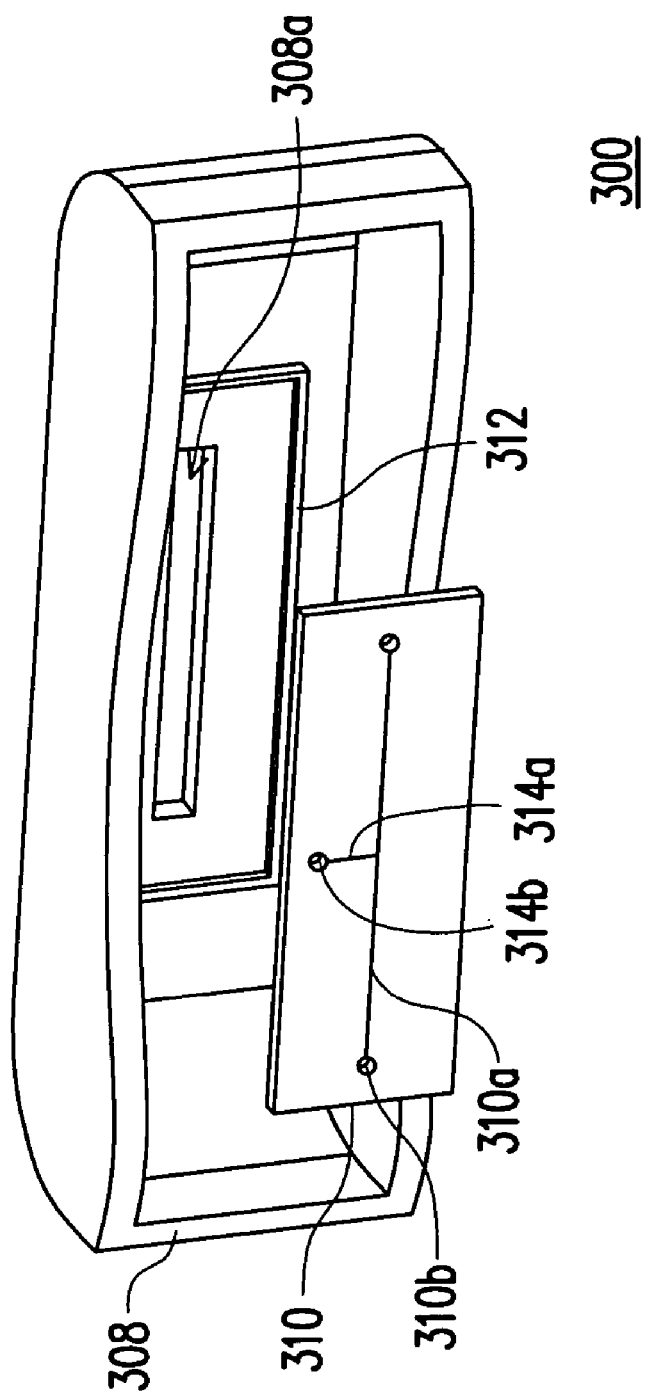
FIG. 3 is a schematic perspective view of a dust-proof structure according to a second embodiment of the present invention.

FIG. 3 is a schematic perspective view of a dust-proof structure 300 according to a second embodiment of the present invention. The dust-proof structure 300 includes a frame 312 configured on an inner surface of a case 308 and surrounding a slot 308a of the case 308. The dust-proof gate 310 is disposed on an inner surface of the case 308 and surrounded by the frame 312. The dust-proof gate 310 covers the slot 308a to prevent dust or particles from entering into an inside of the case through the slot 308a. The dust-proof gate 310 has a first slit 310a and a second slit 314a, both of which are positioned in communication with the slot 308a. The first slit 310a extends in a longitudinal direction parallel to the longitudinal length of the slot 308a. The second slit 314a is substantially perpendicular to the first slit 310a, extends above the first slit 310a, and connects with a midpoint of the first slit 310a.

The setup of the second slit 314a can increase the deformation of the dust-proof gate 310 to facilitate the movement of a card through the dust-proof gate 310. The second slit 314a has an end connected to the first slit 310a and the other end provided with a round hole 314b to reduce the stress concentration induced to the other end when the card is moved through the dust-proof gate 310. Moreover, the first slit 310a has two ends provided with two respective round holes 310b. The setup of the round holes 310b and 314b can avoid stress concentration during an insertion or a withdrawal of the card through the dust-proof gate 310.

Third Embodiment

Figure 4:
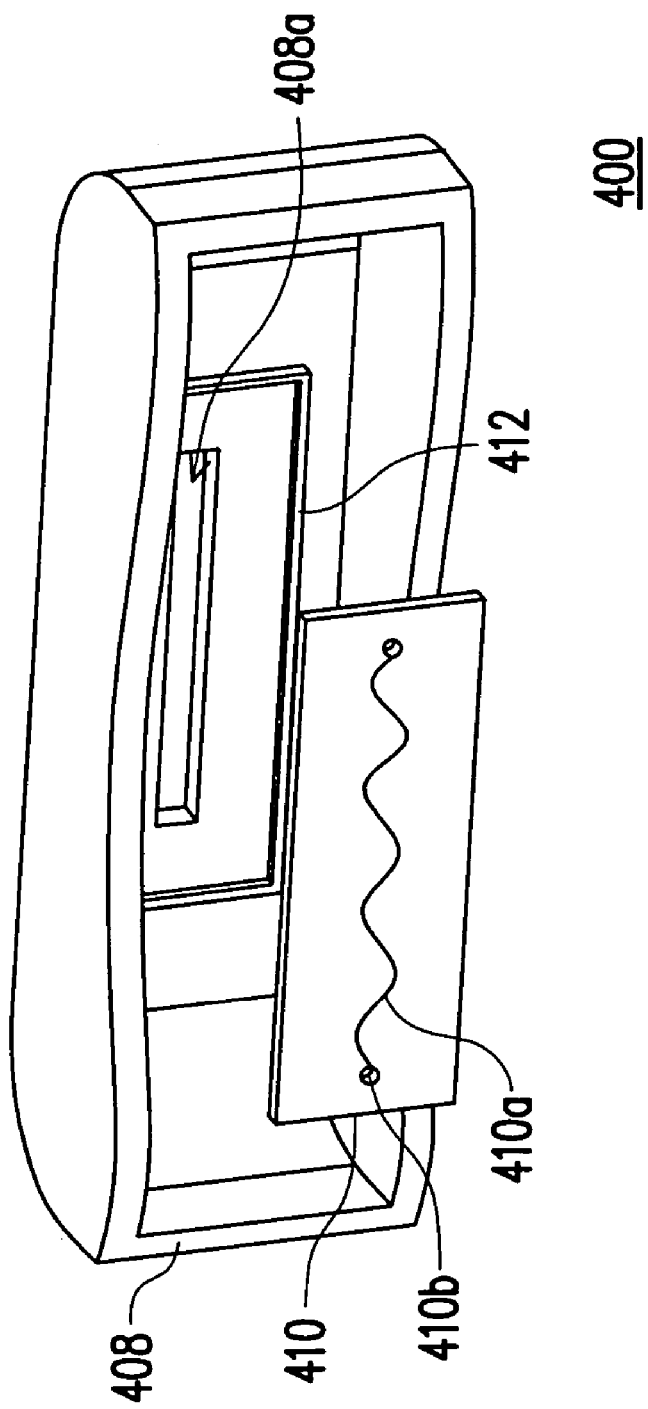
FIG. 4 is a schematic perspective view of a dust-proof structure according to a third embodiment of the present invention.

FIG. 4 is a schematic perspective view showing a dust-proof structure 400 according to a third embodiment of the present invention. The dust-proof structure 400 includes a frame 412 and a dust-proof gate 410. The frame 412 is configured on a case 408 and surrounding a slot 408a in the case 408. The dust-proof gate 410 is disposed on an inner surface of the case 408 and is surrounded by the frame 412. The dust-proof gate 410 covers the slot 408a for preventing dust or particles from entering an inside of the case 408 through the slot 408a. The dust-proof gate 410 has a slit 410a positioned in communication with the slot 408a, wherein the slit 410a is shaped as a wavelike curve. The slit 410a has two ends provided with two respective round holes 410b. The setup of the round holes 410b can avoid the stress concentration during insertion or withdrawal of a card through the slit 410a.

The dust-proof gate 410 with a non-linear slit 410a can remove dust or particles accumulated on a card while being inserted. Therefore, quality of electrical connection between the inserted card and a card connector can be improved.

CONCLUSION

The dust-proof structure of the present invention is suited for being applied to all types of handheld electronic devices, which have an slot in a case thereof for insertion of an electronic card to electrically connect with a card connector in the device to thereby expand the function of the device. The handheld electronic device can be a digital camera, a PDA or a mobile phone, for example. The dust-proof structure of the present invention includes at least the following advantages:

1. The dust-proof structure can effectively prevent dust or particles from infiltrating into the electronic device to contaminate the card connector therein.

2. The dust-proof gate may have two round holes at two ends of the slit. When a card is inserted through the slit, the setup of the round holes can prevent concentration of stress at the two ends of the slit.

3. No matter whether the slit is shaped as a straight line or a non-linear curve, the dust-proof gate can remove dust or particles accumulated on a card during the insertion of the card through the dust-proof gate.

4. The dust-proof structure including the frame and the dust-proof gate is a simple setup and has low manufacturing cost.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A dust-proof structure for a handheld electronic device, the handheld electronic device having a case defining a slot through which an electronic card can move into the handheld electronic device to electrically connect with a card connector therein, the dust-proof structure comprising:
   a frame positioned on said case and surrounding said slot; and
   a dust-proof gate secured to said case, surrounded by the frame and covering the slot, said dust-proof gate having a slit positioned in communication with said slot, said dust-proof gate being made of resilient sponge.

2. The dust-proof structure of claim 1, wherein said frame is integrally formed with said case and on an inner surface of said case.

3. The dust-proof structure of claim 1, wherein said frame is formed separately from the case and is secured to an inner surface of said case by a bonding agent.

4. The dust-proof structure of claim 1, wherein said dust-proof gate has two holes at two ends of said slit.

5. The dust-proof structure of claim 4, wherein said slit has a length not shorter than that of said slot.

6. The dust-proof structure of claim 1, wherein said dust-proof gate further has at least an additional slit positioned in communication with said slot and substantially perpendicular to said slit.

7. The dust-proof structure of claim 6, wherein said dust-proof gate has a hole positioned at an end of said additional slit, which is distant from said slit.

8. The dust-proof structure of claim 1, wherein said slit is shaped as a straight line.

9. The dust-proof structure of claim 1, wherein said slit is shaped as a wavelike curve.

10. A dust-proof structure for preventing dust from entering an electronic device to contaminate an electrical connector in the device, the electronic device having a case defining a slot through which an electronic card can enter the electronic device to electrically connect with the electrical connector, the dust-proof structure comprising a dust-proof gate made of resilient material, secured to said case and covering said slot, said dust-proof gate having a slit positioned in communication with the slot whereby when the electronic card moves through the slot to enter the electronic device, the electronic card also moves through the slit,
   wherein said dust-proof gate has at least one hole at one end of said slit, said slit extends in a direction parallel to a longitudinal length of said slot, and said slit is shaped as a wavelike curve.

11. The dust-proof structure of claim 10, wherein said dust-proof gate further has at least an additional slit positioned in communication with said slot, said additional slit being substantially perpendicular to said slit and connected to said slit.

12. The dust-proof structure of claim 10 further comprising a frame positioned on said case and around said slot, said frame fittingly surrounding said dust-proof gate.

13. The dust-proof structure of claim 12, wherein said frame is integrally formed with said case.

14. A dust-proof structure for preventing dust from entering an electronic device to contaminate a card connector in the electronic device, the electronic device having a case defining a slot through which an electronic card can enter the electronic device to electrically connect with the card connector, said dust-proof structure comprising:
   a dust-proof gate made of resilient material, secured to said case and covering said slot;
   a slit defined in the dust-proof gate, said slit having two holes at its two ends thereof, respectively; and
   a frame on the case and around the slot, the dust-proof gate being surrounded by the frame,
   wherein the dust proof gate is made of resilient sponge.

* * * * *